United States Patent [19]
Frank et al.

[11] Patent Number: 6,157,332
[45] Date of Patent: Dec. 5, 2000

[54] SELF-CALIBRATING VIDEO DIGITAL TO ANALOG CONVERTER

[75] Inventors: Michael Frank, Newtown, Pa.; Zaw Min Soe, Los Gatos, Calif.

[73] Assignee: ATI Technologies, Inc., Thornhill, Canada

[21] Appl. No.: 09/071,254

[22] Filed: May 1, 1998

[51] Int. Cl.[7] .............................. H03M 1/66; H03M 1/10
[52] U.S. Cl. .................. 341/144; 341/118; 341/120; 341/115
[58] Field of Search ................... 341/155, 144, 341/118, 120, 115

[56] References Cited

U.S. PATENT DOCUMENTS

| | | | |
|---|---|---|---|
| 4,677,581 | 6/1987 | Malka et al. | 341/144 |
| 4,967,197 | 10/1990 | Peng | 341/144 |
| 5,278,558 | 1/1994 | Roth | 341/120 |
| 5,345,186 | 9/1994 | Lesmeister | 328/155 |
| 5,703,582 | 12/1997 | Koyama et al. | 341/120 |
| 5,870,044 | 2/1999 | Dell'ova et al. | 341/144 |
| 5,982,317 | 11/1999 | Steensgaard-Madsen | 341/144 |

*Primary Examiner*—Howard L. Williams
*Assistant Examiner*—Jean B. Jeanglaude
*Attorney, Agent, or Firm*—Markison & Reckamp, P.C.

[57] ABSTRACT

A video DAC uses a charge pump to maintain a constant peak to peak amplitude within power supply variations over process and temperature, rather than an external reference signal or a band gap reference. The charge pump performs calibration at full scale output during horizontal sync levels or vertical sync pulses.

10 Claims, 4 Drawing Sheets

SELF-CALIBRATING VIDEO DIGITAL TO ANALOG CONVERTER

BACKGROUND OF THE INVENTION

The present invention relates generally to digital-to-analog converters, and more particularly to a digital-to-analog converter for video and graphics applications which does not require a separate pin for calibration or reference voltage.

Digital-to-analog converters (DACs) are well known. DACs accept a digital input as logical pulses on parallel input lines and output a continuous waveform which represents the input numbers. This conversion is generally accomplished by either a binary weighted-resistor network or a matched resistor ladder network. Other techniques for conversion are also known, and often depend on the technology used to fabricate the DAC (e.g., CMOS, NMOS, TTL, etc.). In any event, several currents are weighted according to the significance they represent and summed at the input of an operational amplifier.

An n-bit DAC provides a well defined analog output which linearly varies from zero to its fall scale value as a digital input varies from 0 to $2^n$-1. Applications for high speed DACs include use in optical disk drives, instrumentation, communications, process control systems, and video data processing. In video processing systems for example, an analog video signal may vary from 0.5 to 2 times a nominal 1 V peak to peak range at the video signal receiving device while a typical power supply voltage may vary by 10% of its nominal value. High speed DACs are often sensitive to both process and temperature variations. As a result, an input digital video signal may not be properly converted to the appropriate analog range necessary for high quality video display. Accordingly, high speed DAC's generally include a reference pin used to calibrate the DAC output so that the DAC maintains a constant peak-to-peak voltage amplitude within power supply variation over process and temperature variation ranges. However, such pins can increase manufacturing cost and system complexity.

Consequently, there exists a need for a DAC that can be calibrated without requiring a separate external reference signal, such as a band gap reference or separate external pin.

DETAILED DESCRIPTION OF THE INVENTION

The disclosed integrated DAC maintains a constant peak to peak amplitude within power supply variations over process and temperature ranges without the use of an external reference signal, pin or a band gap reference. The DAC uses a charge pump based active amplitude calibration method. This calibration method maintains a peak to peak voltage of the DAC over process and temperature variations by self-calibrating at full scale output and by performing self-calibration during video horizontal sync levels or vertical sync pulses.

Figure 1:
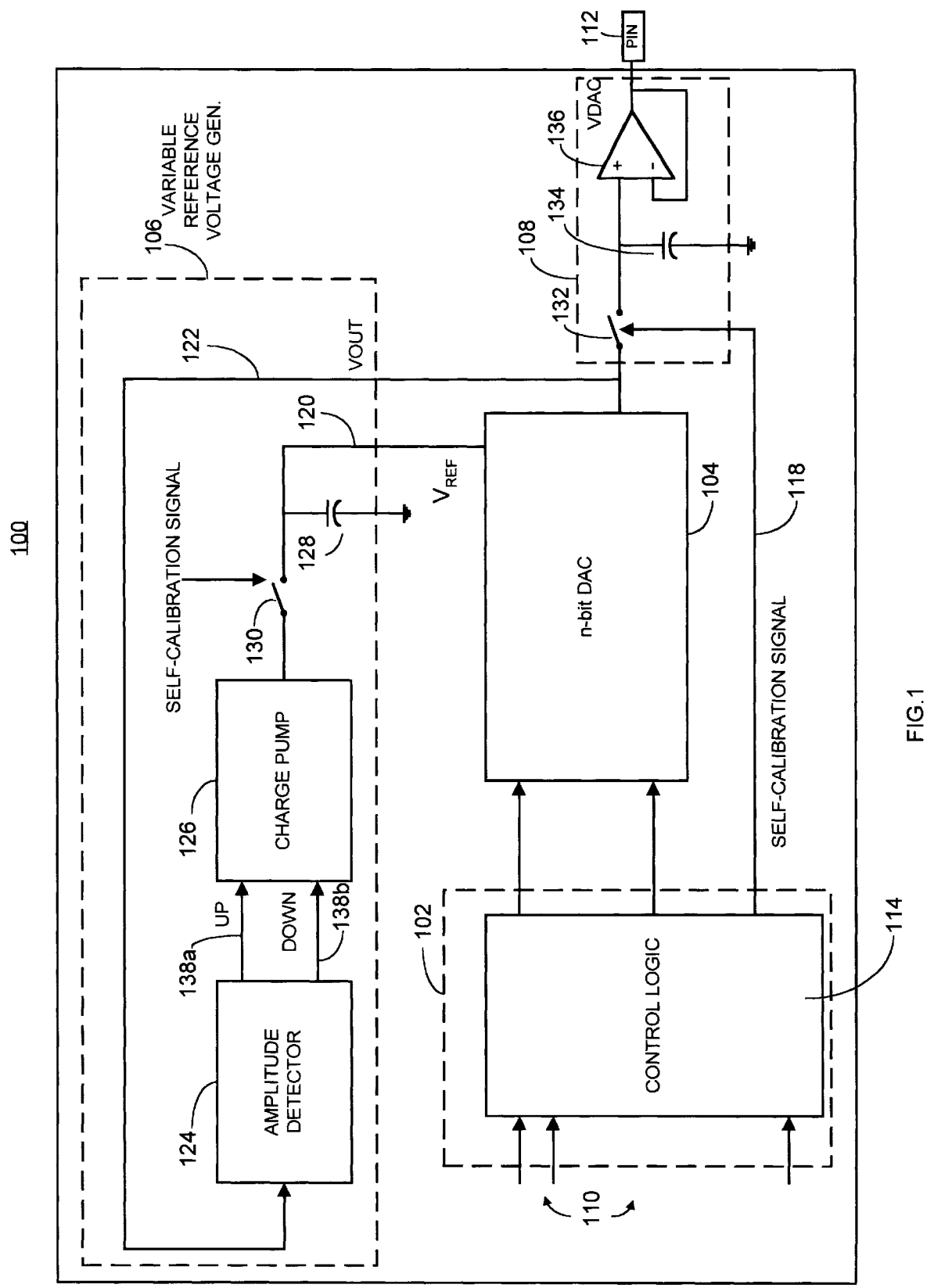
FIG. 1 is a schematic block diagram of a self-calibrating DAC in accordance one embodiment of the invention.

FIG. 1 shows one example of an integrated self-calibrating digital to analog converter 100. The integrated self-calibrating DAC 100 may be fabricated, for example, on a single integrated circuit chip. The integrated self-calibrating DAC 100 includes a self-calibration signal generator 102, an n-bit DAC 104, a variable reference voltage generator 106 and a selective output signal coupler 108. The integrated self-calibrating DAC 100 receives digital input data 110, such as digital video data or other suitable input data. The integrated self-calibrating DAC also includes an external output pin 112 to which a video or graphics display system may be connected that requires analog video signals.

The self-calibration signal generator 102 includes control logic 114 that stores and outputs a copy 116 of digital input data 110 for use by the DAC 104. In addition, the control logic 114 generates an internal self-calibration signal 118 based on the received digital input data 110. For example, the control logic 114 generates the self-calibration signal 118 based on a predetermined pattern of digital input data such as a pattern indicating a "high or low" digital signal condition for a given period of time. The control logic 114 provides digital storage of the n-bit digital input signal in a pipeline stage and provides a copy of the information as the digital input data to the DAC 104. The self-calibration signal 118 in a preferred embodiment is activated, (e.g. "high") in response to the n-bit digital input data 110 having a zero value. The control logic 114 may be any suitable logic circuitry or program that performs the herein described functions.

The variable reference voltage generator 106 employs a feedback signal and generates a switchable and variable DAC control reference voltage 120 based on full scale output voltage amplitudes of output signal VOUT 122. The variable reference voltage generator 106 includes a full scale output amplitude detector 124, a charge pump 126 and a switchable filter capacitor 128 switchable to the charge pump 126 through switch 130. The switch 130 and filter capacitor 128 serve to vary the variable DAC control reference voltage 120 based on predetermined digital input patterns of data 110 by being controllable through the calibration signal 118. The full scale output amplitude detector detects an amplitude of converted analog output data VOUT as generated by the DAC 104. It will be recognized by one of ordinary skill in the art, that current levels may be used instead of voltage levels, if desired.

The selective output signal coupler 108 includes another switch 132 which is also controllable by the self-calibration signal 118. The selective output signal coupler 108 includes another filter capacitor 134 which is connected between the switch 132 and a voltage follower circuit 136, which may be an operational amplifier configured as a voltage follower. The filter capacitor 134 is connected between the DAC 104 and ground. This filter capacitor 134 selectively receives the analog output signal from the DAC 104. The switch 134 has an open position and a closed position. In the open position, the switch 134 allows switchable connection of reference voltage 120 to the DAC 104. The voltage follower circuit 136 is connected to the DAC circuit through switch 132 and receives the analog output signal therefrom. The voltage follower circuit 136 has an output voltage, VDAC, a positive input, and a negative input. The DAC analog output signal VOUT is connected to the positive input of the operational amplifier and the output of the amplifier is connected to the negative input of the operational amplifier.

The amplitude detector 124 receives the analog output signal VOUT and generates an up signal and a down signal 138a and 138b therefrom. The up signal and down signals 138a and 138b serve as inputs to the charge pump 126. The charge pump 126 may be any suitable charge pump as known in the art. The charge pump 126 generates the variable DAC control reference voltage 120 which provides a variable reference voltage 120 to the DAC 104 so that the DAC output range is a maximum over time and temperature variations. The charge capacitor 128, or other suitable capacitive element, is connected between the charge pump 126 and ground and receives the output voltage reference signal 120 in response to the calibration signal. The charge pump 126 converts the up/down signal into a constant current and thereby charges the capacitor 128 such that a voltage out of the capacitor increases or decreases over time, which causes the reference voltage of the DAC to increase or decrease, respectively. The switch 130 has an open position and a closed position. In the open position, the switch 130 prevents transmission of the output voltage reference signal 120 from the charge pump to the capacitor 128 and hence the DAC 104. The switch 132 is opened and the switch 130 is closed in response to the self-calibration signal 118 being active.

When the switch 132 is open the filter capacitor stores the voltage of the DAC circuit 104 at its level prior to the switch 132 being open. Hence the self-calibration signal 118 by opening the switch 132 places the output amplifier 136 in a hold mode during an active mode of the self-calibration signal.

The above circuit operates in a method to maximize the peak to peak voltage of the DAC 104 over process and temperature variation by calibrating at a full scale DAC output voltage levels and also by "hiding" calibration mode during horizontal synchronization levels or vertical synchronization pulses. Hence the system attempts to keep constant peak to peak amplitude within power supply variation without the use of an external reference signal or band gap reference.

Figure 2:
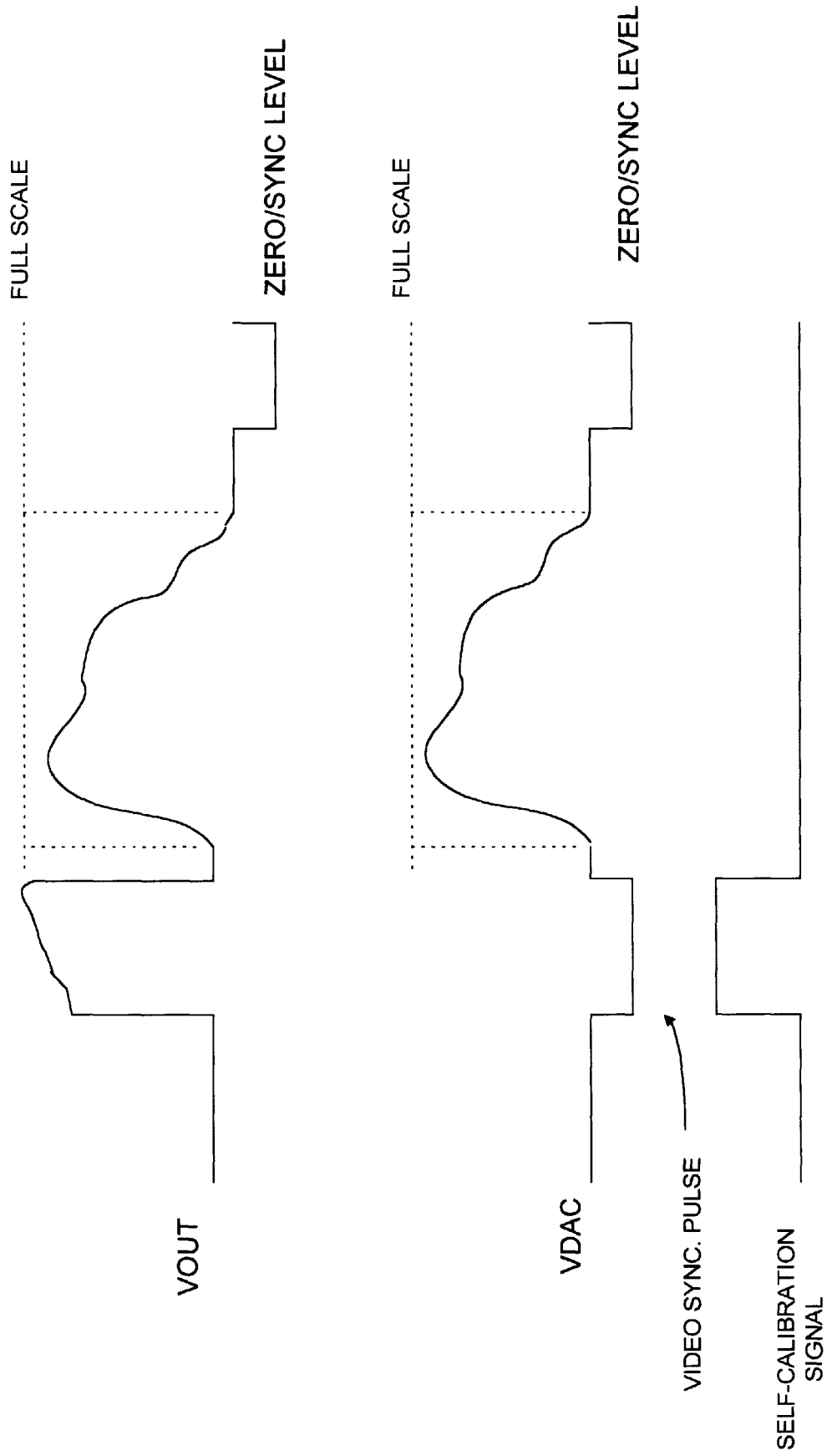
FIG. 2 is a first timing diagram of certain voltage signals of the DAC of FIG. 1.

Referring to FIG. 2, amplitude detection by the amplitude detector 124 is preferably performed when video input data begins a synchronization level. Typically, the synchronization level remains constant for between 4–10 micro seconds depending upon a video signal timing and format. As shown, the (hidden) self-calibration signal 118 is generated during the synchronization pulse.

Figure 4:
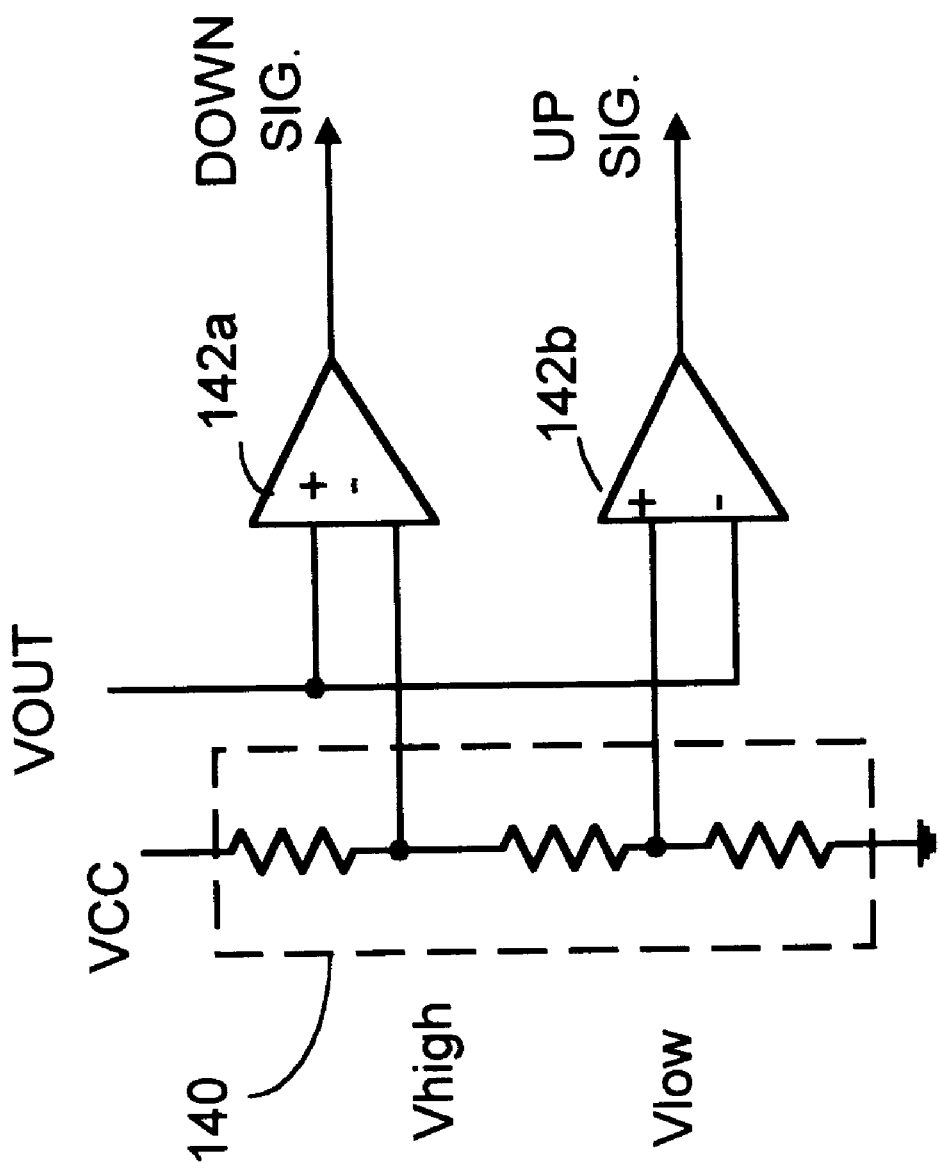
FIG. 4 is a schematic diagram of an amplitude detector circuit in accordance one embodiment of the present invention.

Referring to FIG. 4 and FIG. 1, the amplitude detector 124 has a voltage divider 140, such as a resistor divider. Such a circuit, as known in the art, divides the power supply voltage (VCC) into a desired full scale output level of the DAC 104 within power supply variation, typically 10%. The amplitude detector 124 also includes a pair of comparators 142a and 142b that compare the output voltage VOUT to a corresponding reference voltage (Vhigh or Vlow). For example, if VOUT is above the upper reference voltage Vhigh, a down signal is generated. Conversely, if VOUT is below the lower reference voltage Vlow, an up signal is generated. It will be recognized that a digital equivalent of the reference adjustment may also be used, if desired.

Preferably, the feedback amplitude correction during video synchronization pulses performed by the output voltage VOUT from the DAC being fed back to the amplitude detector 124 to cause a variation in the variable reference voltage 120, is slow, such as on the order of 1 least significant bit per video frame. The full scale output at VOUT will track the average value of the voltage divider output. This observation is implemented in using the charge pump based feedback amplitude locking circuit as shown in FIG. 1.

In operation, when the digital input data 110 remains zero (video synchronization signal) for some period, the self-calibration signal 118 is active during that period. The switch 132 is opened and the switch 130 is closed. The filter capacitor 134 holds the voltage value equal to the zero binary input for the signal level just before the switch 132 is opened. Therefore the video signal output at the external pin 112 does not see any changes in the output VOUT at the DAC 104. The control logic 114 then switches the data input to a full scale input to the DAC or any other suitable digital value. While the switch 132 is open, the charge pump 126 updates (varies) the variable DAC control reference voltage 120 through the feedback loop until VOUT reaches within a desired output amplitude as setup in the amplitude detector 124. This is typically one volt peak to peak. The full scale voltage from the DAC 104 (VOUT) is compared with a voltage divider reference to produce the up/down signals 138a and 138b depending upon the full scale level VOUT. The calibration mode continues until either the self calibration signal 118 becomes inactive (goes low) or the amplitude of VOUT reaches within the power supply variation limit (the rail).

In sum, during operation, the control logic samples digital input data and generates a calibration signal therefrom based on a predetermined input pattern. The calibration signal is provided through switch 132 to an output amplifier to place the output amplifier in a hold mode. The DAC converts the digital input data to analog output data. The self-calibration signal closes a connection between the charge pump and a feedback path thereby forming a current lock loop. The amplitude detector generates an up/down signal based on a comparison of the converted digital output data with the internal reference voltage 120. The charge pump converts the up/down signal into a constant current thereby charging a capacitor such that a feedback voltage of the feedback path increases or decreases over time, which causes a voltage of the DAC to increase or decrease, respectively.

It should be noted that the charge pump 126 moves the charge stored in the capacitor 128 slowly so that the full scale output VOUT changes in the order of about one least significant bit per frame. Furthermore, the switch 130 isolates the variable control reference voltage 120 from the feedback loop when the switch is open. Therefore, the control reference voltage 120 does not change and the video signal output VDAC is constant over several frames while giving enough time for an automatic gain amplifier (e.g., of a television decoder) to react to amplitude fluctuations to allow corresponding amplifiers to operate over a maximum dynamic range.

Figure 3:
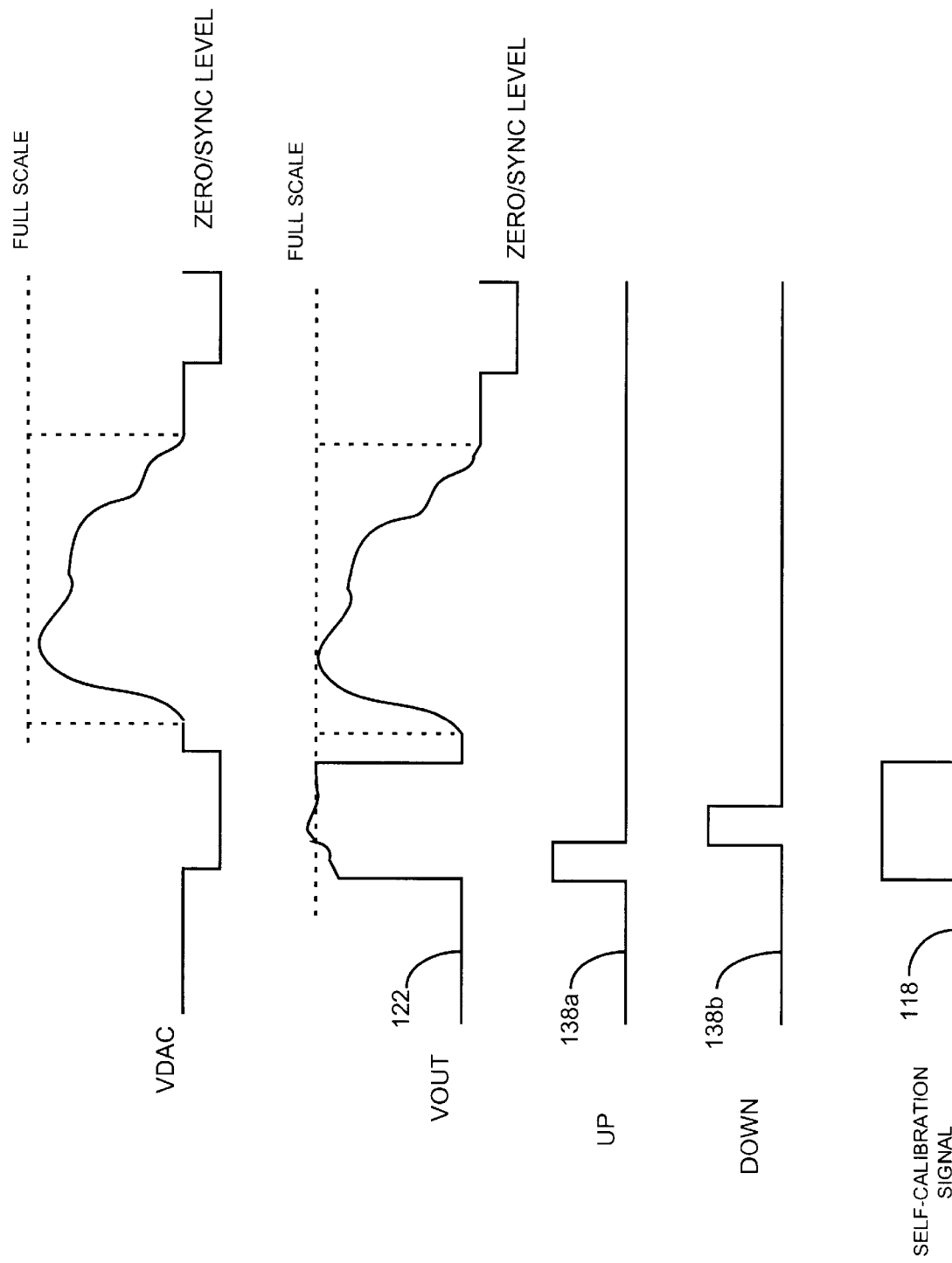
FIG. 3 is a second timing diagram of certain voltage signals of the DAC of FIG. 1.

FIG. 3 shows the self-calibration signal 118 during a video synchronization level. As shown, during the calibration period when the self-calibration signal is high, the full scale level for VOUT is analyzed by the amplitude detector to determine whether an up signal is generated to increase the charge in the supply pump or whether the down signal 138b based on the full scale signal should be generated to reduce the charge from the charge pump or reduce the control reference voltage.

As previously mentioned, the self-calibration signal 118 is preferably controlled so that calibration of the DAC 104 can be hidden within the video synchronization signal of an encoded video signal. The calibration signal should be active for 4–10 micro seconds for example, therefore the best time to perform the calibration is during the wide synchronization pulses that occur during the vertical blanking period. Performing calibration once per field and during a retrace period may also avoid visible artifacts such as bands of varying intensity within a signal frame. Accordingly, the self-calibration signal generator 102 generates a self-calibration signal 118 during occurrences of vertical synchronization pulses to facilitate active calibration during a portion of an input not containing video information. Similarly if desired, the control logic 114 may generate the self-calibration signal 118 during occurrences of horizontal synchronization pulses to facilitate active calibration during a portion of an input signal not containing video information.

Referring again to FIG. 1, the amplitude detector 124 is preferably made using a voltage divider which activates the up signal 138a when the DAC or VOUT is less than 1 volt and generates the down signal 138b when the VOUT signal is greater than 1 volt.

It should be understood that the implementation of other variations and modifications of the invention in its various aspects will be apparent to those of ordinary skill in the art, and that the invention is not limited by the specific embodiments described. It is therefore contemplated to cover by the present invention, any and all modifications, variations, or equivalents that fall within the spirit and scope of the basic underlying principles disclosed and claimed herein.

What is claimed is:

1. A digital-to-analog converter (DAC) for converting an n-bit digital input signal to an analog output signal, the DAC comprising:

a control logic circuit which receives the n-bit digital input signal and generates a self-calibration signal therefrom;

a converter circuit which receives a copy of the n-bit digital input signal from the control logic circuit and generates an analog output signal therefrom;

a first filter capacitor connected between the converter circuit and ground, the first filter capacitor receiving the analog output signal;

a first switch connected between the converter circuit and the first filter capacitor, the first switch having an open position and a closed position, wherein in the open position, the first switch prevents transmission of the analog output signal from the converter circuit to the first filter capacitor;

an amplitude detector which receives the analog output signal and generates an up signal and a down signal therefrom;

a charge pump which receives the up signal and the down signal and generates an output voltage reference signal therefrom, wherein the output voltage reference signal provides a reference voltage to the converter circuit;

a second filter capacitor connected between the charge pump and ground, the second filter capacitor receiving the output voltage reference signal; and a second switch connected between the charge pump and the converter circuit, the second switch having an open position and a closed position, wherein in the open position, the second switch prevents transmission of the output reference voltage signal from the charge pump to the converter circuit;

wherein the first switch is opened and the second switch is closed in response to the calibration signal being active.

2. The DAC as recited in claim 1 wherein the control logic provides digital storage of the n-bit digital input signal.

3. The DAC as recited in claim 1 wherein the calibration signal is activated in response to the n-bit digital input signal having a zero value.

4. The DAC as recited in claim 1 further comprising an operational amplifier connected to the converter circuit and receiving the analog output signal therefrom, the operational amplifier having a VDAC output, a plus input, and a minus input, wherein the converter circuit analog output signal is connected to the plus input and the operational amplifier VDAC output is connected to the operational amplifier minus input.

5. The DAC as recited in claim 1 wherein when the first switch is in the open position, the first filter capacitor stores the voltage of the converter circuit analog output signal.

6. The DAC as recited in claim 1 wherein the amplitude detector comprises a voltage divider circuit.

7. The DAC as recited in claim 6 wherein the voltage divider activates the up signal when the converter circuit analog output signal is less than 1 volt and activates the down signal when the converter analog output signal is greater than 1 volt.

8. A method of calibrating a digital-to-analog converter (DAC) comprising the steps of:

sampling digital input data and generating a calibration signal therefrom based on a predetermined input pattern, the calibration signal being provided to an output amplifier to place the output amplifier in a hold mode;

converting the digital input data to analog output data;

closing a connection between a charge pump and a capacitive element in response to the calibration signal;

generating an up/down signal with an amplitude detector based on a comparison of a converted digital output data with an internally generated reference voltage; and converting the up/down signal into a constant current in the charge pump and thereby charging the capacitive element such that a voltage out of the capacitive element increases or decreases over time, which causes a voltage of the DAC to increase or decrease, respectively.

9. The method of claim 8 wherein the digital-to-analog converter is calibrated during a vertical blanking period.

10. The method of claim 8 further comprising the step of iteratively repeating the process until a steady state voltage is reached, at which time the DAC is in a calibrated state.

* * * * *